(12) United States Patent
Smith

(10) Patent No.: US 10,451,404 B2
(45) Date of Patent: Oct. 22, 2019

(54) OPTICAL POSITIONING SENSOR

(71) Applicant: Rememdia LC, Salt Lake City, UT (US)

(72) Inventor: Fraser M. Smith, Salt Lake City, UT (US)

(73) Assignee: Rememdia LC, Salt Lake City, UT (US)

( * ) Notice: Subject to any disclaimer, the term of this patent is extended or adjusted under 35 U.S.C. 154(b) by 0 days.

(21) Appl. No.: 16/267,628

(22) Filed: Feb. 5, 2019

(65) Prior Publication Data

US 2019/0170501 A1 Jun. 6, 2019

Related U.S. Application Data

(63) Continuation of application No. 15/855,391, filed on Dec. 27, 2017, now Pat. No. 10,197,383, which is a
(Continued)

(51) Int. Cl.

| H04N 5/00 | (2011.01) |
|---|---|
| G01B 11/00 | (2006.01) |
| H01L 27/146 | (2006.01) |
| G01J 1/02 | (2006.01) |
| G01B 11/16 | (2006.01) |
| G01D 5/26 | (2006.01) |
| G01P 3/36 | (2006.01) |

(Continued)

(52) U.S. Cl.
CPC ............ *G01B 11/002* (2013.01); *G01B 11/14* (2013.01); *G01B 11/16* (2013.01); *G01D 5/26* (2013.01); *G01D 5/262* (2013.01); *G01J 1/0266* (2013.01); *G01J 1/0271* (2013.01); *G01L 1/24* (2013.01); *G01P 3/36* (2013.01);

*G01P 15/093* (2013.01); *H01L 27/146* (2013.01); *H01L 27/14643* (2013.01)

(58) Field of Classification Search
CPC .. H04N 5/2252; H04N 5/2253; H04N 5/2256; G01J 1/4257
USPC ............... 250/221, 222.1, 239; 356/614, 622
See application file for complete search history.

(56) References Cited

U.S. PATENT DOCUMENTS

| 5,148,018 A | 9/1992 | Ammann |
| 9,848,122 B2 * | 12/2017 | Smith ................ H04N 5/23229 |

(Continued)

FOREIGN PATENT DOCUMENTS

| JP | H04350513 A | 12/1992 |
| JP | 2011257267 A | 12/2011 |

*Primary Examiner* — Kevin K Pyo
(74) *Attorney, Agent, or Firm* — Volpe and Koenig, P.C.

(57) ABSTRACT

A sensor is disclosed that provides measurements in multiple degrees of freedom without significantly increasing size, complexity, or cost. The sensor can include a light component in support of a first light source operable to direct a first beam of light, and a second light source operable to direct a second beam of light. The sensor can also include an imaging device that can directly receive the first beam of light and the second beam of light and convert these into electric signals. The imaging device and the light component can be movable relative to one another. The sensor can further include a light location module and/or a position module configured to receive the electric signals and determine locations of the first beam of light, the second beam of light on the imaging device and a relative position of the imaging device and the light component.

10 Claims, 8 Drawing Sheets

Related U.S. Application Data continuation of application No. 15/482,126, filed on Apr. 17, 2017, now Pat. No. 9,874,433, which is a continuation of application No. 15/005,411, filed on Jan. 25, 2016, now Pat. No. 9,651,365, which is a continuation of application No. 13/937,922, filed on Jul. 9, 2013, now Pat. No. 9,245,916.

(51) Int. Cl.
  *G01P 15/093*   (2006.01)
  *G01B 11/14*   (2006.01)
  *G01L 1/24*   (2006.01)

(56) References Cited

U.S. PATENT DOCUMENTS

| | | |
|---|---|---|
| 9,874,433 B2 | 1/2018 | Smith |
| 2004/0027586 A1 | 2/2004 | Ichikawa et al. |
| 2011/0154907 A1 | 6/2011 | Schmidt et al. |
| 2016/0309083 A1 | 10/2016 | Smith |

* cited by examiner

OPTICAL POSITIONING SENSOR

CROSS REFERENCE TO RELATED APPLICATIONS

This application is a continuation of U.S. patent application Ser. No. 15/855,391 filed on Dec. 27, 2017 which is a continuation of U.S. patent application Ser. No. 15/482,126, filed Apr. 7, 2017, now U.S. Pat. No. 9,874,433, which is a continuation of U.S. patent application Ser. No. 15/005,411, filed Jan. 25, 2016, now U.S. Pat. No. 9,651,365, which is a continuation of U.S. patent application Ser. No. 13/937,922, filed Jul. 9, 2013, now U.S. Pat. No. 9,245,916, issued Jan. 15, 2015, which is incorporated by reference as if fully set forth.

Sensors are used in a wide range of applications and are adapted to measure a wide variety of quantities. Many sensors can determine a desired quantity using a displacement measurement, such as a position sensor, a strain gage, a load cell, an accelerometer, an inertial measurement unit, a pressure gage, etc.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Figure 1:
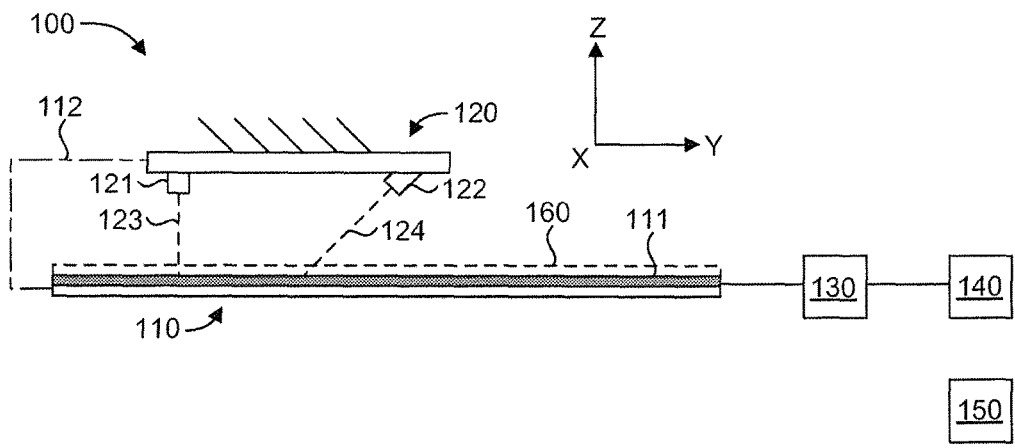
FIG. 1 is a side schematic view of a sensor in accordance with an embodiment of the present invention.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

Although typical sensors are generally effective for a given purpose, they often do not produce the same level of resolution in each degree of freedom. Additionally, obtaining measurement redundancy and/or measurements in multiple degrees of freedom can significantly increase size, complexity, and cost, which can preclude using redundant or multiple degree of freedom sensors in some applications. Thus, redundant sensors or multiple degree of freedom sensors can be more readily utilized by maintaining size, complexity, and cost within practical limits, such as those approximating single degree of freedom sensors.

Accordingly, a sensor is disclosed that can provide for redundancy and/or measurement in multiple degrees of freedom without significantly increasing size, complexity, or cost. In one aspect, the sensor can be adapted to measure any given quantity that can be determined using a displacement measurement. The sensor can include a light component in support of a first light source operable to direct a first beam of light, and a second light source operable to direct a second beam of light. The sensor can also include an imaging device positioned proximate the light component and operable to directly receive the first beam of light and the second beam of light and convert these into electric signals. The imaging device and the light component can be movable relative to one another. The sensor can further include a light location module configured to receive the electric signals and determine locations of the first beam of light and the second beam of light on the imaging device. In addition, the sensor can include a position module configured to determine a relative position of the imaging device and the light component based on the locations of the first beam of light and the second beam of light on the imaging device.

In one aspect, a multi degree of freedom sensor is disclosed. The multi degree of freedom sensor can include a light component in support of a first light source operable to direct a first beam of light, and a second light source operable to direct a second beam of light non-parallel to the first beam of light. The multi degree of freedom sensor can also include an imaging device positioned proximate the light component and operable to directly receive the first beam of light and the second beam of light and convert these into electric signals. The imaging device and the light component can be movable relative to one another in at least two translational degrees of freedom and at least two rotational degrees of freedom. The multi degree of freedom sensor can further include a light location module configured to receive the electric signals and determine locations of the first beam of light and the second beam of light on the imaging device. Additionally, the multi degree of freedom sensor can include a position module configured to determine a relative position of the imaging device and the light component based on the locations of the first beam of light and the second beam of light on the imaging device.

In another aspect, a multi degree of freedom sensor is disclosed. The multi degree of freedom sensor can include a light component in support of a plurality of light sources operable to direct beams of light. The multi degree of freedom sensor can also include an imaging device positioned proximate the light component and operable to directly receive the beams of light and convert these into electric signals. The imaging device and the light component can be movable relative to one another in a plurality of translational degrees of freedom and a plurality of rotational degrees of freedom. The multi degree of freedom sensor can further include a light location module configured to receive the electric signals and determine locations of the beams of light on the imaging device. Additionally, the multi degree of freedom sensor can include a position module configured to determine a relative position of the imaging device and the light component based on the locations of the beams of light on the imaging device.

Figure 2:
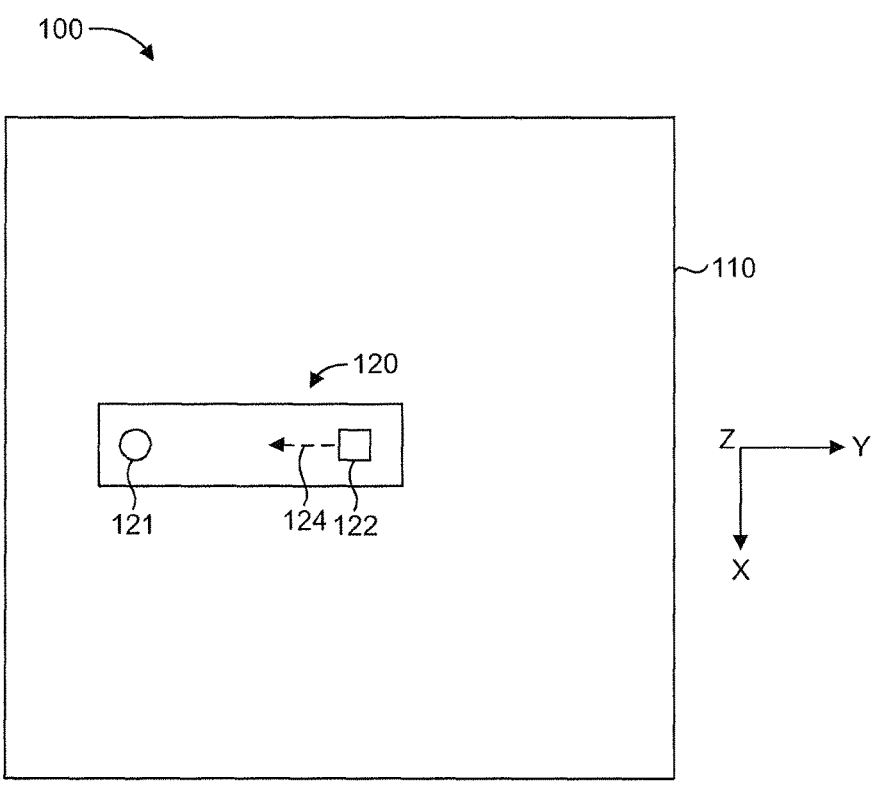
FIG. 2 is a top schematic view of a light component of the sensor of FIG. 1.

One embodiment of a sensor 100 is illustrated schematically in FIGS. 1 and 2. The sensor 100 can comprise an imaging device 110. The imaging device 110 can comprise an image sensor 111, such as a pixel sensor, photo sensor, or any other suitable type of imager that can convert light into electrical signals. In one aspect, the imaging device 110 can comprise an active pixel sensor having an integrated circuit containing an array of pixel sensors, wherein each pixel contains a photodetector and an active amplifier. Circuitry next to each photodetector can convert the light energy to a voltage. Additional circuitry may be included to convert the voltage to digital data. One example of an active pixel sensor is a complementary metal oxide semiconductor (CMOS) image sensor. In another aspect, the image device 110 can comprise a charge-coupled device (CCD) image sensor. In a CCD image sensor, pixels can be represented by p-doped MOS capacitors. These capacitors are biased above the threshold for inversion when light acquisition begins, allowing the conversion of incoming photons into electron charges at a semiconductor-oxide interface. The CCD is then used to read out these charges. Additional circuitry can convert the voltage into digital information. The imaging device 110 can therefore include any suitable device or sensor that is operable to capture light and convert it into electrical signals, such as an imaging sensor typically found in digital cameras, cell phones, web cams, etc.

Figure 3A:
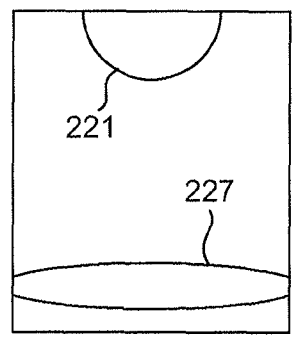
FIG. 3A illustrates a side schematic view of a light source of a sensor in accordance with an embodiment of the present invention.
Figure 3B:
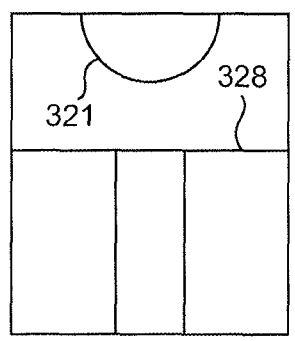
FIG. 3B illustrates a side schematic view of a light source of a sensor in accordance with another embodiment of the present invention.

The sensor 100 can also include a light component 120 in support of one or more light sources 121, 122 operable to direct beams of light 123, 124, respectively. The light source 121, 122 can comprises an LED, a laser, an organic LED, a field emission display element, a surface-conduction electron-emitter display unit, a quantum dot, a cell containing an electrically charged ionized gas, a fluorescent lamp, a hole through which light from a larger light source located external to the plane of light emission can pass, and/or any other suitable light source. FIG. 3A illustrates a lens 227 operable with a light source 221 to focus or direct light from the light source 221 into a suitable beam of light. FIG. 3B illustrates a collimator 328 operable with a light source 321 to "narrow" light from the light source 321 into a suitable beam of light. It should be recognized that a lens and a collimator can be used alone or in any combination with a light source to achieve a suitable beam of light.

The imaging device 110 can be positioned proximate the light component 120 and operable to directly receive the beams of light 123, 124 and convert these into electric signals. A light location module 130 can be configured to receive the electric signals and determine locations of the beams of light 123, 124 on the imaging device 110. For example, pixels of the imaging device 110 can be individually addressed such that the light intensity on each individual pixel may be known or determined by the light location module 130.

The imaging device 110 and the light component 120 can be movable relative to one another in one or more degrees of freedom. Thus, a position module 140 can be configured to determine a relative position of the imaging device 110 and the light component 120 based on the locations of the beams of light 123, 124 on the imaging device 110. In one aspect, the imaging device 110 and the light component 120 can be coupled 112 to one another in a manner that facilitates relative movement. For example, the light component 120 can be "fixed" and the imaging device 110 can be supported about the light component 120 by a structure, device, or mechanism that can facilitate movement of the imaging device 110 relative to the light component 120. It should be recognized that in some embodiments the imaging device 110 can be "fixed." The imaging device 110 and the light component 120 can be constrained for relative movement only in one or more selected degrees of freedom, such as translation in the X axis or rotation about the Z axis. Any suitable arrangement of the imaging device 110 and the light component 120 is contemplated that facilitates relative movement of the imaging device 110 and the light component 120 in one or more desired degrees of freedom.

Such relative movement of the imaging device 110 and the light component 120 can facilitate measurement of a relative movement, such as a relative displacement and/or a rotation. Accordingly, a sensor in accordance with the present disclosure can be operable to measure or sense any quantity that can be based on, or that can be derived from, a relative movement, such as displacement, rotation, velocity, acceleration, etc. For example, a sensor as described herein can function as a position sensor, a strain gage, an accelerometer, a load sensor, or any other type of sensor that can utilize a relative motion to mechanically and/or computationally provide a measurement of a desired type. In one aspect, therefore, the sensor 100 can also include a clock 150 to measure elapsed time associated with a relative movement, as may be useful for determining velocity, acceleration, or other dynamic measurement quantities.

In addition, because the individual addresses of the pixels are known, the sensor 100 can be considered an "absolute" sensor. This attribute allows the sensor 100 to be powered off when not needed (i.e., to conserve energy) and powered on again to take a measurement or reading without needing to be initialized or otherwise calibrated to determine the relative position of the imaging device 110 and the light component 120.

The imaging device 110 can comprise a pixel array of any suitable size, dimension, aspect ratio, and/or pixel count. For example, the pixel array can be a one-dimensional array or a two-dimensional array, such as an array of pixels arranged in rows and columns. In one aspect, a range of motion of the sensor can be limited by the size of the imaging device, although multiple imaging devices can be disposed adjacent to one another to provide a greater range of motion for the sensor. In another aspect, a range of motion of the sensor can be impacted by the location and/or size of the light sources. Thus, light sources can be located and/or sized to accommodate the desired relative movements between the light component and the imaging device. It should be recognized that a sensor in accordance with the present disclosure can also produce substantially the same level of resolution in each degree of freedom.

In one aspect, center locations of the beams of light 123, 124 on the imaging device 110 can be determined utilizing a statistical method applied to the locations of the beams of light 123, 124 on the imaging device 110. Such computations can be performed by the position module 140. For example, each beam of light 123, 124 can be distributed across many pixels on the imaging device 110 and can exhibit an intensity gradient that can be analyzed using statistical methods to determine the center of the beam.

In another aspect, the imaging device 110 can be monochromatic or chromatic and the light sources 121, 122 can produce any suitable color of light, such as white, red, green, or blue. The color selectivity of chromatic pixels to specific light beam wavelengths can be utilized to effectively increase pixel populations, which can be used to determine the location of the center of the beams without degradation from a neighboring light beam on the imaging device. For example, three light sources (red, green, and blue) can be used in close proximity to one another with a chromatic imaging device in place of a single light source with a monochromatic imaging device to determine a relative movement of the light component 120 and the imaging device 110 without interference from one another. The chromatic imaging device can track or sense different color light beams separately, even though the light beams may overlap on the imaging device. Different parts of the imaging device corresponding to different colors can generate separate signals that can be used to determine the relative movement of the light source and the imaging device, such as by providing redundancy and/or additional data points for computation.

Thus, in one aspect, the imaging device can comprise a color separation mechanism 160. Any suitable color separation mechanism can be used, such as a Bayer sensor in which a color filter array passes red, green, or blue light to selected pixel sensors, a Foveon X3 sensor in which an array of layered pixel sensors separate light via the inherent wavelength-dependent absorption property of silicon, such that every location senses all three color channels, or a 3CCD sensor that has three discrete image sensors, with the color separation done by a dichroic prism.

FIGS. 4-7B, with continued reference to FIGS. 1 and 2, illustrate the sensor 100 undergoing relative movement of the imaging device 110 and the light component 120. The light source 121 produces light beam 123 that can be referred to generally as a "perpendicular" light beam, in that the light beam 123 is perpendicular or substantially perpendicular to the imaging device 110 in a nominal relative orientation of the imaging device 110 and the light component 120. The light source 122 produces light beam 124 that can be referred to generally as an "angled" light beam, in that the light beam 124 is at a non-perpendicular and non-parallel angle to the imaging device 110 in a nominal relative orientation of the imaging device 110 and the light component 120. The light sources 121, 122 can therefore be termed perpendicular and angled light sources, respectively.

Figure 4:
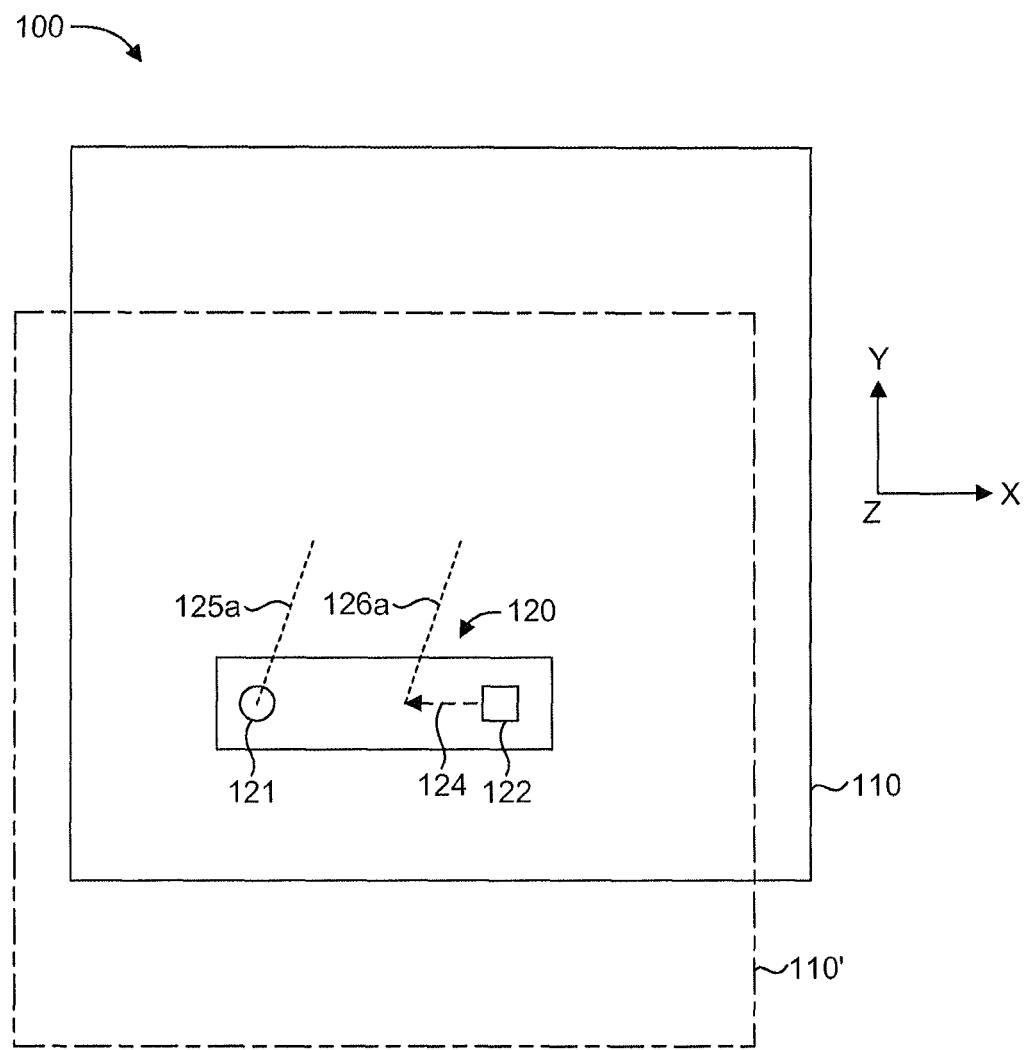
FIG. 4 is a top schematic view of the sensor of FIG. 1 undergoing relative movement of a light component and an imaging component in two translational degrees of freedom, in accordance with an embodiment of the present invention.

In general, a single light source can be used to determine relative movement in two translational degrees of freedom. As shown in FIG. 4 for example, the light source 121, which directs the light beam 123 substantially perpendicular to the X and Y translational degrees of freedom, can be used to determine relative movement of the imaging device 110 and the light component 120 in these two translational degrees of freedom. In addition, the light source 122, which directs the light beam 124 non-parallel to the light beam 123, can be used to determine relative movement of the imaging device 110 and the light component 120 in the X and Y translational degrees of freedom. Movement by the light beams 123, 124 can trace paths 125 *a*, 126 *a*, respectively, along the imaging device 110 as the imaging device 110' moves from an initial position to the final position of the imaging device 110. Pixels along each of the paths 125 *a*, 126 *a* can be used to determine the relative motion of the imaging device 110 and the light component 120, such as by providing redundancy and/or additional data points for computation.

Figure 5:
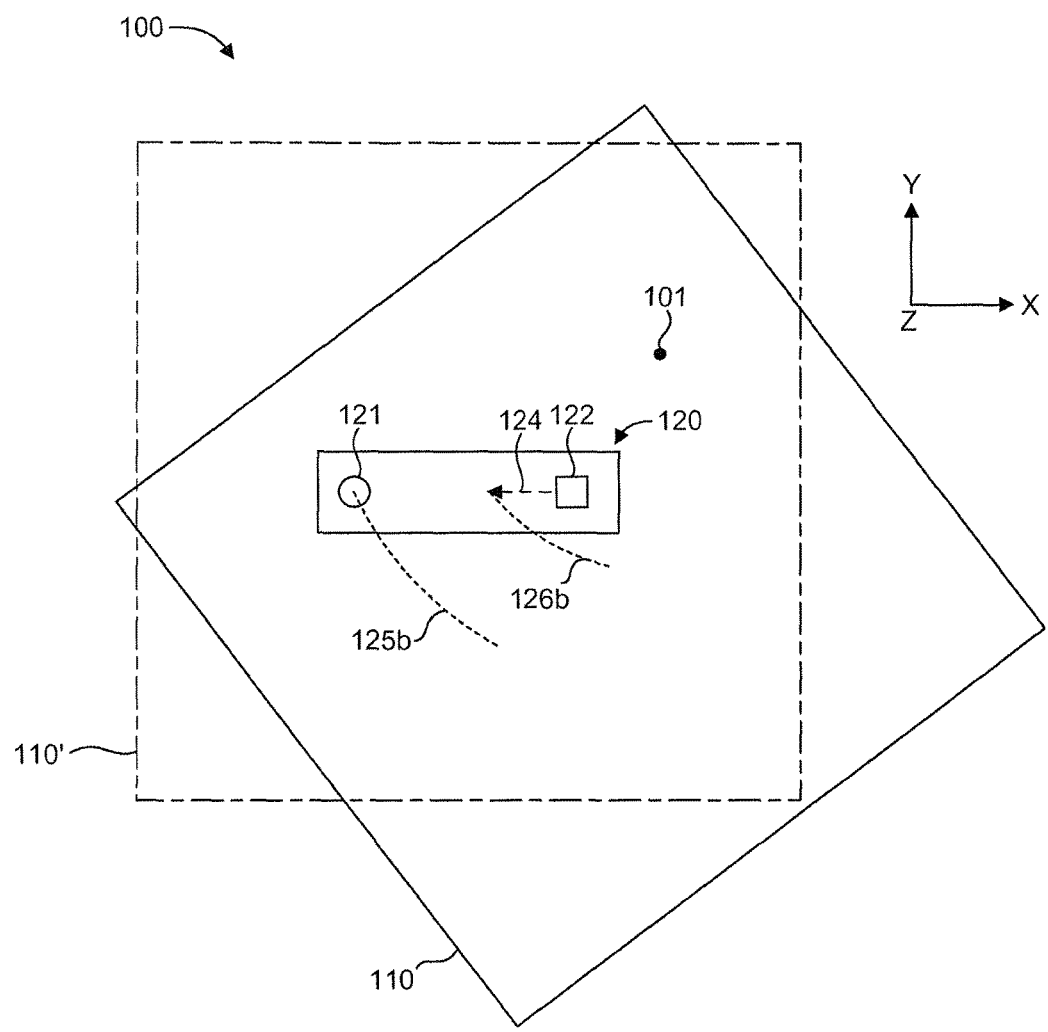
FIG. 5 is a top schematic view of the sensor of FIG. 1 undergoing relative movement of a light component and an imaging component in a rotational degree of freedom, in accordance with an embodiment of the present invention.

As shown in FIG. 5, and with further reference to FIGS. 1 and 2, the imaging device 110 and the light component 120 can be movable relative to one another in a rotational degree of freedom, in this case about the Z axis. Movement by the light beams 123, 124 can trace paths 125 *b*, 126 *b*, respectively, along the imaging device 110 as the imaging device 110' moves from an initial position to the final position of the imaging device 110. Pixels along the paths 125 *b*, 126 *b* of both light beams 123, 124, respectively, can be used to determine the relative motion of the imaging device 110 and the light component 120, which in this case has a center of rotation 101. As illustrated, the light beam 123 is directed substantially parallel to the axis of the rotational degree of freedom and the light beam 124 is non-parallel to the light beam 123. In other words, a perpendicular beam and an angled beam are used. It should be recognized, however, that relative movement in the translational and rotational degrees of freedom shown in FIGS. 5 and 6 can be determined with two perpendicular beams or two angled beams.

Figure 6:
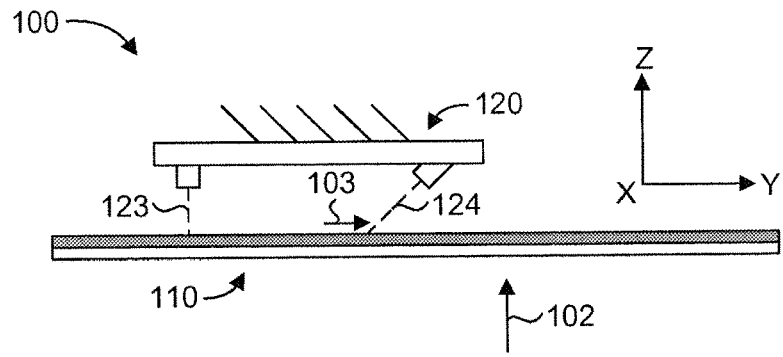
FIG. 6 is a side schematic view of the sensor of FIG. 1 undergoing relative movement of a light component and an imaging component in a translational degree of freedom, in accordance with another embodiment of the present invention.

FIG. 6 illustrates that the imaging device and the light component can be movable relative to one another in a translational degree of freedom, in this case, along the Z axis. In other words, the perpendicular light beam 123 is directed substantially parallel to the axis of the translational degree of freedom and the angled light beam 124 is non-parallel to the light beam 123, such that relative movement of the imaging device 110 and the light component 120 in the translational degree of freedom causes the light beam 123 and/or the light beam 124 to be directed onto different locations of the imaging device 110. For example, as the imaging device 110 moves in direction 102 along the Z axis toward the light component 120, the angled light beam 124 moves in direction 103 along the imaging device 110. This movement of the angled light beam 124 can be used to determine the relative translational movement along the Z axis. In addition, the lack of movement of the perpendicular light beam 123 can also factor into a determination of the relative translational movement along the Z axis. It should be recognized, therefore, that a single angled beam of light can be used to determine relative movement in three orthogonal translational degrees of freedom.

Figure 7A:
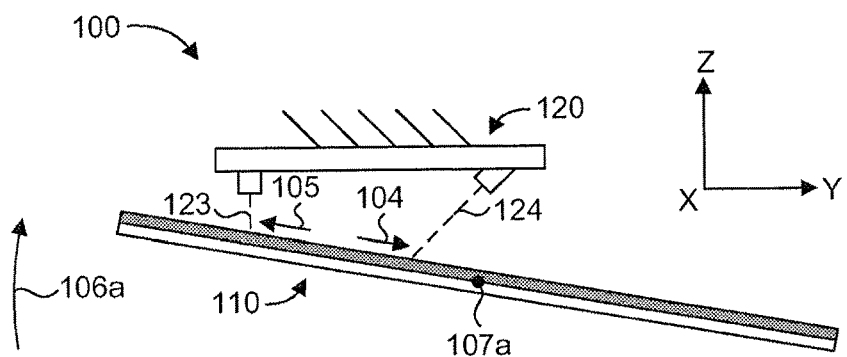
FIG. 7A is a side schematic view of the sensor of FIG. 1 undergoing relative movement of a light component and an imaging component in a rotational degree of freedom, in accordance with another embodiment of the present invention.
Figure 7B:
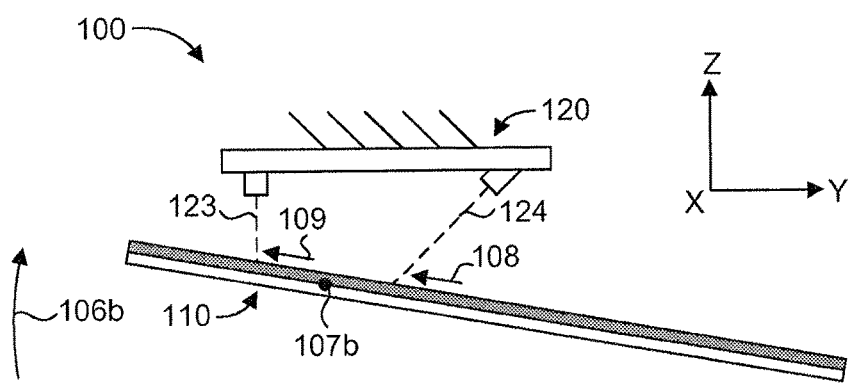
FIG. 7B is a side schematic view of the sensor of FIG. 1 undergoing relative movement of a light component and an imaging component in a rotational degree of freedom, in accordance with yet another embodiment of the present invention.

FIGS. 7A and 7B illustrate further use of the angled light beam 124 in determining relative movement of the imaging device 110 and the light component 120 in a rotational degree of freedom, in this case about the X axis. Thus, the perpendicular light beam 123 is directed substantially perpendicular to the axis of the rotational degree of freedom. As shown in FIG. 7A, angled light beam 124 moves in direction 104 along the imaging device 110 and perpendicular light beam 123 moves in opposite direction 105 along the imaging device 110. The difference in directions as well as the relative locations of the light beams 123, 124 on the imaging device 110 and the angle 127 of the angled light beam 124 can be used to determine that the imaging device 110 rotated relative to the light component 120 in direction 106 a about a center of rotation 107 a. In this case, both light beams 123, 124 are on the "same side" of the center of rotation 107 a.

As shown in FIG. 7B on the other hand, angled light beam 124 moves in direction 108 along the imaging device 110 and perpendicular light beam 123 moves in the same direction 109 along the imaging device 110. The similarity in directions as well as the relative locations of the light beams 123, 124 on the imaging device 110 and the angle 127 of the angled light beam 124 can be used to determine that the imaging device 110 rotated relative to the light component 120 in direction 106 b about a center of rotation 107 b. In this case, both light beams 123, 124 are on "opposite sides" of the center of rotation 107 b. Thus, the movement and direction of the angled beam 124 and the perpendicular beam 123 along the imaging device 110 can be used to determine the relative movement of the imaging device 110 and the light component 120 in a rotational degree of freedom that tends to move portions of the imaging device 110 and the light component 120 toward one another, such as rotation about the X axis.

It should be recognized that a sensor in accordance with the present disclosure can have multiple translational degrees of freedom and/or multiple rotational degrees of freedom. Additional light sources, over the two light sources 121, 122 of sensor 100, can reduce or eliminate situations that can "trick" the sensor into incorrectly determining a relative movement, particularly when complex movements are compounded into multiple translational and rotational degrees of freedom. Another benefit of additional light sources, in general, is improved resolution of the sensor, in that there is more light movement across the imaging device and therefore more pixels to interrogate to obtain data can be utilized to determine the relative movement of the imaging device and the light component. A further benefit of additional light sources, over two light sources, is simplified calculation algorithms.

Figure 8:
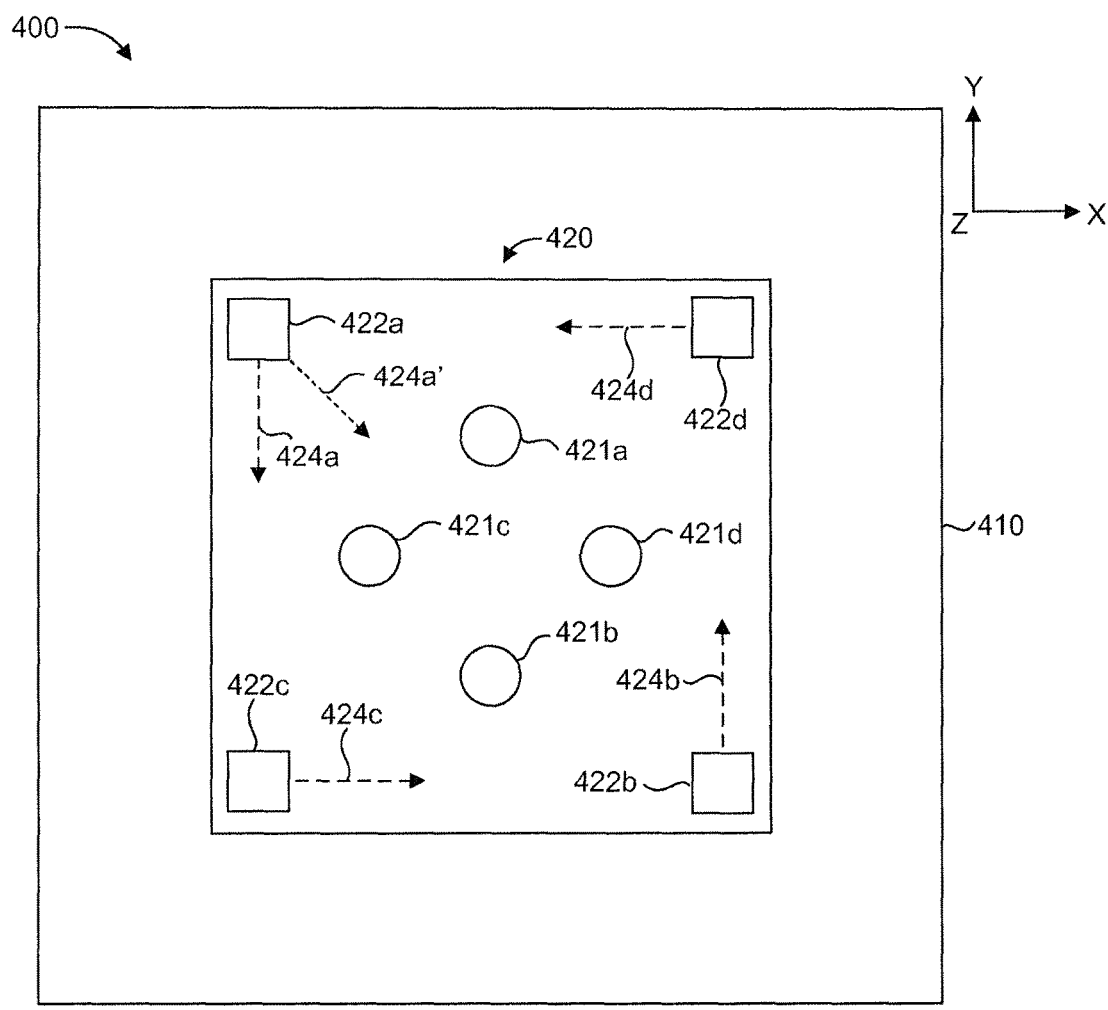
FIG. 8 is a top schematic view of a light component of a sensor in accordance with another embodiment of the present invention.

Accordingly, FIG. 8 illustrates an embodiment of a sensor 400 that can eliminate potential computational ambiguities as well as improve resolution due to the number, placement, and orientation of the light sources, particularly when undergoing relative movement in multiple degrees of freedom. For example, the sensor 400 can include four perpendicular light sources 421 a-d and four angled light sources 422 a-d. In one aspect, the angled light sources 422 a-d can be oriented to direct light beams 424 a-d in planes parallel to degree of freedom axes. For example, light beams 424 a, 424 b are in planes parallel to the Y axis and light beams 424 c, 424 d are in planes parallel to the X axis. It should be recognized, however, that the angled light beams can be oriented in any direction, as illustrated by light beam 424 a', which is oriented in some arbitrary direction.

The particular arrangement shown in the figure has the perpendicular light sources 421 a-d located in a center portion of the light component 420 and angled light sources 422 a-d located generally about a periphery of the perpendicular light sources 421 a-d. Due to their nominal perpendicular orientation with respect to the imaging device 410, the light beams generated by the perpendicular light sources 421 a-d will not "sweep across" as much of the imaging device 410 as the light beams 424 a-d of the angled light sources 422 a-d during movement that alters a relative position of the imaging device 410 and the light component in the Z axis, such as Z axis translation, or rotation about the X and Y axes. Light sources, such as the angled light sources 422 a-d, can therefore be positioned and/or oriented to provide greater movement across the imaging device 410 for relative movements of the imaging device 410 and the light component 420 in certain degrees of freedom, which can enhance the resolution of the sensor data. Thus, grouping the perpendicular light sources 421 a-d in a center portion and disposing the angled light sources 422 a-d about a periphery of the perpendicular light sources 421 a-d can be an efficient placement configuration for maximizing effective use of the imaging device area available with an increased number of light sources 421 a-d, 422 a-d. In one aspect, colored light sources and a color separation mechanism can also be employed to fit an increased number of light sources into a small area without degrading the performance of the sensor.

The number of light sources and the placement and orientation of the light sources shown in the figure is merely illustrative of a configuration that can be used to ensure that no relative movement of the imaging device and light component can "trick" the sensor into a faulty or incorrect reading. It should be recognized therefore that any number of perpendicular or angled light sources can be used in any relative position or orientation to achieve a desired result, such as redundancy or level of resolution.

Figure 9:
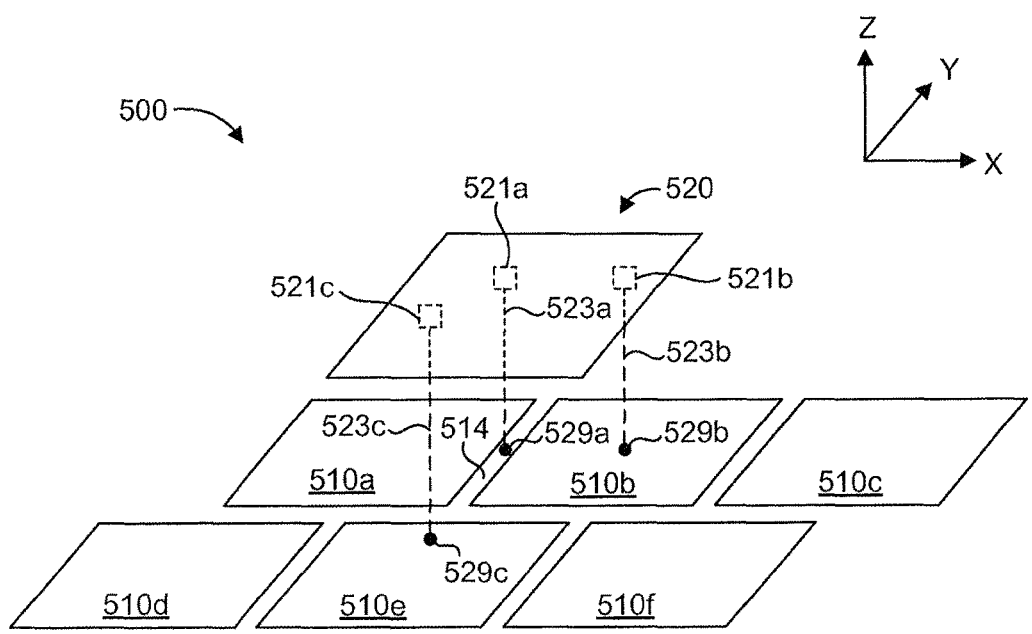
FIG. 9 is a perspective schematic view of a sensor in accordance with yet another embodiment of the present invention.

FIG. 9 illustrates another embodiment of a sensor 500 that can include multiple light sources 510 a-c as well as multiple imaging devices 510 a-f disposed adjacent to one another to provide continuous measurement over a larger range of motion that may available using only a single imaging device. For example, the sensor 500 can include any of the features and elements described hereinabove, such as a light component 520 in support of the light sources 521 a-c (which may be perpendicular and/or angled) that direct light beams 523 a-c, respectively, toward one or more of the imaging devices 510 a-f at a given time. As shown, the imaging devices 510 a-f are arranged in a staggered configuration with a region 514 in between imaging devices where no image sensor is present, such as at an interface between adjacent imaging devices. A light beam 523 a may terminate 529 a in the region 514 between adjacent imaging devices 510 a, 510 b, in which case the light beam 523 a will not contribute to the position determining functionality of the sensor 500. However, in this case, light beams 523 b, 523 c can terminate 529 b, 529 c on imaging devices 510 b, 510 e, respectively, to contribute to the position determining functionality of the sensor 500 even when the light beam 523

*a* cannot. In other words, the other imaging devices 510 *b*, 510 *e* still receiving light beams 523 *b*. 523 *c*, respectively, can compensate for the loss of signal from any given light source, such as 521 *a*. In one aspect, the number and/or arrangement of imaging devices and/or light sources can be configured to ensure that at least one light source will terminate on an imaging device throughout a desired range of motion of the sensor and in any degree of freedom of the sensor Thus, in this way, multiple light sources can be used to ensure that the sensor 500 is operable to determine relative position of the light component 520 and the imaging devices 510 *a-f* even when a light source is directing a beam of light to an area that is without an image sensor.

Figure 10A:
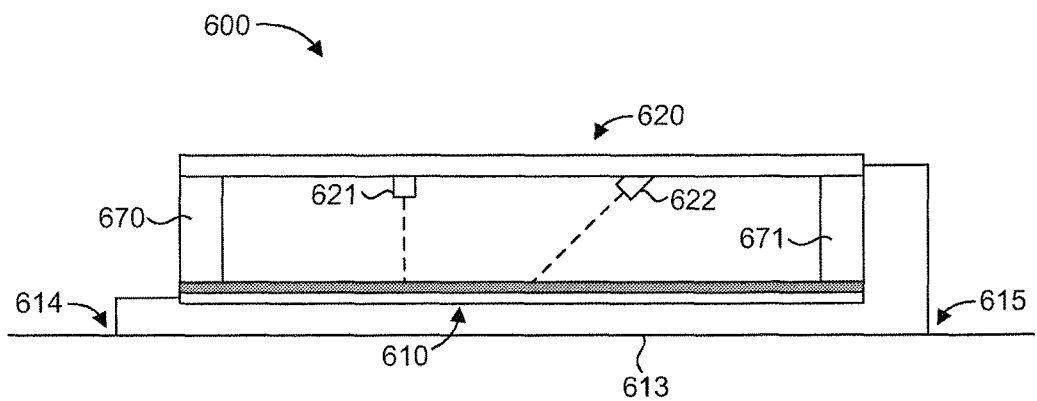
FIG. 10A is a side schematic view of a sensor in accordance with yet another embodiment of the present invention.
Figure 10B:
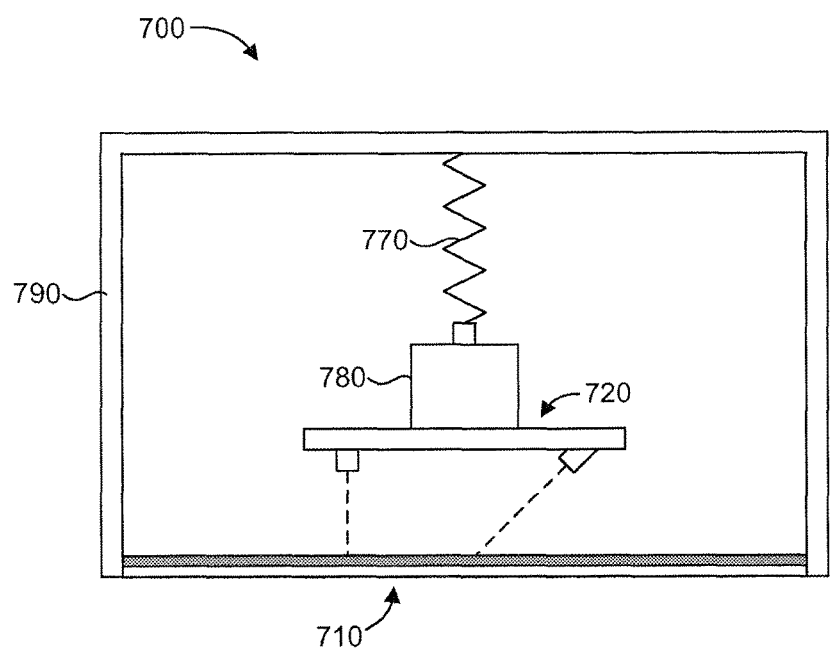
FIG. 10B is a side schematic view of a sensor in accordance with still another embodiment of the present invention.

With reference to FIGS. 10A and 10B, illustrated are two additional sensors in accordance with the present disclosure. For example, FIG. 10A illustrates a sensor 600 having an elastic member 670, 671 coupled to the imaging device 610 and the light component 620 to facilitate relative movement of the imaging device 610 and the light component 620. The elastic member 670, 671 can establish a nominal relative position for the imaging device 610 and the light component 620 and can facilitate relative movement of the imaging device 610 and the light component 620 in any suitable degree of freedom. The elastic member 670, 671 can comprise a spring, which can be configured as any suitable metal spring or as an elastomeric spring. Thus, in one aspect, the elastic member 670, 671 can act as a polymer suspension system for the imaging device 610 and the light component 620.

In one aspect, the elastic member 670, 671 can be disposed outboard of the light sources 621, 622. In another aspect, the elastic member can comprise a transparent layer disposed between the imaging device 610 and the light component 620. In one embodiment, the elastic member can comprise a silicone layer that acts as a separator between the imaging device 610 and the light component 620, which may provide a low displacement and high resolution sensor. In one aspect, the range of motion for the sensor 600 can be limited by the size of the imaging device 610 and the type of suspension or separation structure, which can depend on the magnitude of the desired range of motion and/or the application of the particular sensor.

For example, one application for the sensor 600 can be as a strain gage. In this case, the imaging device 610 can be anchored to a surface 613 at location 614 and the light component can be anchored to the surface 613 at location 615. As the surface 613 experiences strain, the imaging device 610 and the light component 620 will move relative to one another, which movement can serve to facilitate measurement of the strain in one or more degrees of freedom.

FIG. 10B illustrates another example of a sensor 700 having a mass 780 associated with the light component 720, which can enable the sensor 700 to measure acceleration and/or function as a navigation aid. The mass 780 and the light component 720 can be supported by an elastic member 770, such as a spring, to facilitate relative movement of the imaging device 710 and the light component 720 in one or more degrees of freedom. In one aspect, the elastic member 770 can be coupled to a support structure 790, which can be coupled to the imaging device 710. Although the light component 720 is shown in the figure as being associated with the mass 780 and suspended by the elastic member 770, it should be recognized that the imaging device 710 can be associated with the mass 780 and suspended by the elastic member 770.

In another example of a sensor (not shown), a whisker can be coupled to an imaging device or a light component and placed in a flow field to determine boundary layer thickness. In yet another example of a sensor (not shown), an imaging sensor and a light component can be configured for continuous relative rotation to measure rotary position.

In accordance with one embodiment of the present invention, a method for facilitating a displacement measurement is disclosed. The method can comprise providing a light component in support of a first light source operable to direct a first beam of light, and a second light source operable to direct a second beam of light. The method can also comprise providing an imaging device positioned proximate to the light component and operable to directly receive the first beam of light and the second beam of light and convert these into electric signals. The method can further comprise providing a light location module configured to receive the electric signals and determine locations of the first beam of light and the second beam of light on the imaging device. The method can still further comprise providing a position module configured to determine a relative position of the imaging device and the light component based on the locations of the first beam of light and the second beam of light on the imaging device. Additionally, the method can comprise facilitating relative movement of the imaging device and the light component. It is noted that no specific order is required in this method, though generally in one embodiment, these method steps can be carried out sequentially.

In one aspect of the method, the second beam of light is non-parallel to the first beam of light. In another aspect of the method, facilitating relative movement of the imaging device and the light component comprises facilitating relative movement in at least one of a translational degree of freedom and a rotational degree of freedom.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The invention claimed is:

1. A sensor, comprising:
a first light source that generates a first beam of light;
a second light source that generates a second beam of light, wherein the first light source and the second light source are supported by a light support structure;
an imager that receives the first beam of light and the second beam of light, wherein the imager and the light support structure are movable relative to one another; and
a transparent layer formed between the imager and the light support structure, wherein the transparent layer is operable to facilitate relative movement of the imager and the light support structure;
wherein the sensor:
determines locations of the first beam of light and the second beam of light on the imager, and
determines a relative position of the imager and the light support structure based on the locations of the first beam of light and the second beam of light.

2. The sensor according to claim 1, wherein the second beam of light is non-parallel to the first beam of light.

3. The sensor according to claim 1,
wherein the first light source is a monochromatic light source and the first beam of light is a first color,
wherein the second light source is a monochromatic light source and the second beam of light is a second color; and
wherein the imager includes:
a first monochromatic detector that receives light of the first color and converts the light of the first color into a first electrical signal, and
a second monochromatic detector that receives light of the second color and converts the light of the second color into a second electrical signal.

4. The sensor according to claim 1,
wherein the first light source is a chromatic light source and the second light source is a chromatic light source; and
wherein the imager includes:
a color separation mechanism that separates the first beam of light and the second beam of light into a beam of light of a first color and a beam of light of a second color,
a first monochromatic detector receives the beam of light of the first color and converts the beam of light of the first color into a first electrical signal, and
a second monochromatic detector that receives the beam of light of the second color and converts the beam of light of the second color into a second electrical signal.

5. The sensor according to claim 1, wherein the sensor further determines the relative movement of the light support structure and the imager in multiple degrees of freedom.

6. The sensor according to claim 1, wherein the transparent layer is formed from silicone.

7. The sensor according to claim 1, wherein the light support structure is mechanically coupled to an object to be sensed; and
the sensor further calculates a strain on a surface of the object in one or more degrees of freedom based on the relative position of the imager and the light support structure.

8. The sensor according to claim 1, wherein the light support structure further supports a known mass; and
the sensor further determines acceleration based on the known mass and the relative position of the imager and the light support structure.

9. The sensor according to claim 1, further comprising:
one or more additional light sources that each generate a respective beam of light, wherein the one or more additional light sources; and
wherein the imager receives each respective beam of light, and the sensor further determines the relative position of the imager and the light support structure based on locations of each respective beam of light determined by the sensor.

10. The sensor according to claim 1, wherein the imager is a chromatic imaging device that senses different color light beams separately.

* * * * *

UNITED STATES PATENT AND TRADEMARK OFFICE
CERTIFICATE OF CORRECTION

PATENT NO. : 10,451,404 B2
APPLICATION NO. : 16/267628
DATED : October 22, 2019
INVENTOR(S) : Fraser M. Smith It is certified that error appears in the above-identified patent and that said Letters Patent is hereby corrected as shown below:

On the Title Page

On Page 2, item (63), under "Related U.S. Application Data", in Column 1, Line 2, delete "Apr. 17, 2017," and insert -- Apr. 7, 2017, --, therefor.

Signed and Sealed this
Twenty-ninth Day of August, 2023

*Katherine Kelly Vidal*

Katherine Kelly Vidal
*Director of the United States Patent and Trademark Office*